United States Patent
Ho

(10) Patent No.: US 7,436,008 B2
(45) Date of Patent: Oct. 14, 2008

(54) POWER AND GROUND SHIELD MESH TO REMOVE BOTH CAPACITIVE AND INDUCTIVE SIGNAL COUPLING EFFECTS OF ROUTING IN INTEGRATED CIRCUIT DEVICE

(75) Inventor: Iu-Meng Tom Ho, Milpitas, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 11/698,330

(22) Filed: Jan. 25, 2007

(65) Prior Publication Data

US 2007/0120261 A1 May 31, 2007

Related U.S. Application Data

(60) Division of application No. 10/810,748, filed on Mar. 26, 2004, now Pat. No. 7,217,887, which is a continuation of application No. 10/132,996, filed on Apr. 25, 2002, now Pat. No. 6,734,472.

(51) Int. Cl.
*H01L 27/10* (2006.01)
(52) U.S. Cl. .................... 257/207; 257/208; 257/211
(58) Field of Classification Search .......... 257/207, 257/208, 211
See application file for complete search history.

(56) References Cited

U.S. PATENT DOCUMENTS 4,353,040 A 10/1982 Krumm et al.
5,288,949 A 2/1994 Crafts (Continued)

OTHER PUBLICATIONS

Khatri, G. S. et al. "A novel VLSI layout fabric for deep sub-micron applications," in *Proceedings of the Design Automation Conference*, (New Orleans), Jun. 1999.

(Continued)

*Primary Examiner*—Thien F Tran
(74) *Attorney, Agent, or Firm*—Blakely, Sokoloff, Taylor & Zafman LLP

(57) ABSTRACT

A power and ground shield mesh to remove both capacitive and inductive signal coupling effects of routing in integrated circuit device. An embodiment describes the routing of a shield mesh of both power and ground lines to remove noise created by capacitive and inductive coupling. Relatively long signal lines are routed in between fully connected power and ground shield mesh which may be generated by a router during the signal routing phase or during power mesh routing phase. Leaving only the odd tracks or the even tracks for signal routing, power mesh (VDD) and ground mesh (VSS) are routed and fully interconnected leaving shorter segments and thereby reducing the RC effect of the circuit device. Another embodiment presents a technique where the signals are shielded using the power and ground mesh for a gridless routing. Another embodiment presents a multi-layer grid routing technique where signals are routed on even grid and the power and ground lines are routed on odd grid. A similar embodiment represents grid routing technique where the signals are routed between layers N and N+1. Another embodiment enables signals to be shielded by opposite power and ground grids on left, right, top and bottom. Additional embodiments also include utilization of similar mesh utilized in standard cell and/or in the gate array routing area or any other area where any other signal line is to be shielded.

8 Claims, 10 Drawing Sheets

U.S. PATENT DOCUMENTS

| | | |
|---|---|---|
| 5,723,908 A | 3/1998 | Fuchida et al. |
| 6,348,722 B1 | 2/2002 | Yoshikoshi |
| 6,388,200 B2 | 5/2002 | Schaper |
| 2001/0013422 A1 | 8/2001 | Schaper |
| 2003/0155642 A1 | 8/2003 | Davis et al. |

OTHER PUBLICATIONS

Khatri, Sunil P. et al. "Cross-talk Immune VLSI Design using a Network of PLAs Embedded in a Regular Layout Fabric", IEEE/ACM International Conference on Computer Aided Design, ICCAD-2000, Nov. 5-9, 2000, San Jose, CA, USA.

Magma Design Automation, Inc. "Deep-Submicron Signal Integrity", white paper, 2002.

Mezhiba, Andrey V. and Friedman, Eby G. "Scaling Trends of On-Chip Power Distribution Noise", SLIP'02, Apr. 6-7, 2002, San Diego, California, USA, pp. 47-53.

Nassif, Sani R. and Fakhouri, O. "Technology Trends in Power-Grid-Induced Noise", SLIP'02, Apr. 6-7, 2002, San Diego, California, USA, pp. 55-59.

PCT International Search Report for PCT International Appln. No. US02/24267, mailed May 10, 2004 (6 pages).

Shin, Seongkyun et al. "Analytical Signal Integrity Verification Models for Inductance-Dominant Multi-Coupled VLSI Interconnects", SLIP'02, Apr. 6-7, 2002, San Diego, California, USA, pp. 61-68.

POWER AND GROUND SHIELD MESH TO REMOVE BOTH CAPACITIVE AND INDUCTIVE SIGNAL COUPLING EFFECTS OF ROUTING IN INTEGRATED CIRCUIT DEVICE

This application is a divisional of U.S. patent application Ser. No. 10/810,748, filed on Mar. 26, 2004 now U.S. Pat. No. 7,217,887, which is a continuation of U.S. patent application Ser. No. 10/132,996, filed on Apr. 25, 2002, now issued as U.S. Pat. No. 6,734,472.

BACKGROUND OF THE INVENTION

1. Field of the Invention

The field of the present invention pertains to circuitry to solve the problems caused by capacitive and inductive coupling in signals in an integrated circuit device. This particular issue of capacitive and inductive coupling in signals is becoming increasingly difficult as the industry advances and moves towards reduction in circuit device size (for example, from 0.25 uM technology to 0.18 uM, 0.15 uM, 0.13 uM and beyond).

2. Related Art

With their growth in commercial markets and consumer demands for smaller Integrated Circuits (ICs—which are used in numerous applications such as cellular phones, wristwatch cameras, and hand-held organizers just to name a few) increase, IC size requirement trends continue towards a small form factor and lowered power consumption. As these IC size requirements shrink, semiconductor manufacturers are forced to design circuits at a much smaller level than in the past. Previously, as the industry moved from Very Large Scale Integration (VLSI) to Ultra Large Scale Integration (ULSI), the relative capacitive and inductive coupling of the circuit itself was not realized to be as critical of an issue.

However, as the semiconductor industry designs and implements circuitry on sub-micron level technology (where spacing between circuitry lines is less than $10^{-6}$ m) and beyond, the capacitive and inductive coupling of the signal lines within the circuitry itself is realized to be a critical problem for designers. As circuit size becomes smaller and the relative distances for signal lines becomes longer, the problem of coupling and or cross talk between signal lines and ground or power lines becomes more evident. Furthermore, as the signal line to ground coupling and/or other signal lines becomes stronger, the signal to noise ratio for given signals increases proportionally. This particular issue of capacitive and inductive coupling in signals is becoming increasingly difficult as the industry advances and moves towards reduction in circuit device size (for example, from 0.25 uM technology to 0.18 uM, 0.15 uM, 0.13 uM and beyond).

One prior art approach to minimize the signal to noise ratio (or capacitive and inductive coupling), is to strengthen the signal drive level. By increasing the signal strength, the total signal to noise ratio is reduced. Unfortunately, to increase the signal strength, the device must also be supplied higher power. This solution is inconsistent with the modern trend of reducing power consumption in ICs for heat issues, portability issues and environmental issues. In addition to higher power requirement, this prior art approach does not eliminate the coupling issue.

Another prior art approach is to reduce the effective (R-L-C) impedance of the signal lines and thereby increasing the spacing between signal lines. In general, increasing the spacing between signal lines by three-fold, the coupling effect will only be reduced by fifty percent. This prior art approach is usually combined with the first prior art approach to minimize coupling and reduce signal to noise ratio. This approach is inconsistent with modern trends for circuit compactness.

Yet another prior art approach is to shield the signal lines by using either a supply voltage like VDD or ground. Utilizing this prior art approach, the shielding line (ground) would need to be wide enough (with low impedance) so that the shield itself will not begin to transfer the noise to other signal lines.

These prior art approaches that tend to compensate by increasing signal strength combined with the prior art approach of providing a shielding line adjacent to signal line are shown in FIG. 1. As shown in this depiction, 100, the signal line 110 is routed along with the shielding line 120, which is then utilized to shield the noise from a neighboring signal line. For sub-micron technologies, the lengths of these signal and shield lines can become relatively long with respect to line thickness and thus can lead to high signal to noise ratio or cross-talk within a said circuit on a given substrate.

Therefore, a need exists for reducing the capacitive and inductive signal coupling effects of routing resources of an IC device.

SUMMARY OF THE INVENTION

Accordingly, the present invention minimizes and reduces the signal coupling effects caused by. capacitive and/or inductive signal coupling effects of routing in an integrated circuit device. These and other objects and advantages of the present invention will no doubt become obvious to those of ordinary skill in the art after having read the following detailed description of the preferred embodiments which are illustrated in the various drawing figures.

The present invention discloses a circuit composed of a power and ground shield mesh to remove both capacitive and inductive signal coupling effects of routing an integrated circuit device. The shield mesh is included in addition to the power and ground grid typically provided in an IC. The units of the shield mesh are placed such that they surround routing resources of the integrated circuit. Specifically, one embodiment of the present invention describes a method of routing a shield mesh of both power and ground lines to remove noise created by capacitive and inductive coupling. Alternating mesh lines of VDD and VSS (or ground) are laid down and signal routing resources are placed in-between. The shield mesh can be single or multi-layered. The shield mesh is included in addition to a power grid and may be connected to the power grid.

As Very Deep Sub-Micron (VDSM) technologies continue to reduce in size (for example from 0.18 uM, 0.15 uM, 0.13 uM, 0.11 uM and beyond), the signal lines become even more susceptible to capacitive and inductive coupling and noise from other neighboring signal lines. Relatively long signal lines are routed in between fully connected power and ground shielding mesh which is typically generated by a router during the signal routing phase or during power mesh routing phase. In one embodiment, leaving only the odd tracks or the even tracks for signal routing, power mesh (VDD) and ground mesh (VSS) are routed and fully interconnected leaving shorter segments and thereby reducing the RC effect of the circuit device.

Another embodiment of the invention describes a technique where the signals are shielded using the power and ground mesh for a gridless routing. Another embodiment of the invention presents a multi-layer grid routing technique where signals are routed on an even grid and the power and ground lines are routed on an odd grid. A similar embodiment of the invention represents grid routing technique where the signals are routed between layers N and N+1. While another embodiment of the invention enables signals to be shielded by opposite power and ground grids on left, right, top and bottom. Additional embodiments of the invention also include utilization of similar mesh utilized in standard cell and/or in the gate array routing area or any other area where any other signal line is to be shielded, thereby reducing the effective resistive or RC component of the power or grounding lines.

More specifically, an embodiment of the present invention is drawn to an integrated circuit device comprising: a) a plurality of signal lines disposed within a substrate; b) a power grid disposed on the substrate and comprising: a plurality of power lines having a first thickness; and a plurality of ground lines having the first thickness, the power grid for supplying power and ground to circuitry of the substrate; and c) a shield mesh disposed on the substrate and comprising: a plurality of power lines having a second thickness; and a plurality of ground lines having the second thickness, wherein respective signal lines of the plurality of signal lines are disposed between a respective power line of the shield mesh and a respective ground line of the shield mesh, the shield mesh for reducing the effects of electronic cross-talk between nearby signal lines of the plurality of signal lines. Embodiments include the above and wherein the power and ground lines of the shield mesh are alternatively disposed and parallel to each other within a single metal layer of the substrate.

Other embodiments include an integrated circuit as described above generally and wherein the power and ground lines of the shield mesh are alternatively disposed in a first direction parallel to each other within a first metal layer of the substrate and wherein the power and ground lines of the shield. mesh are also alternatively disposed in a second direction parallel to each other within a second metal layer of the substrate, the second metal layer being underneath the first metal layer and wherein the first and second directions are 90 degrees apart.

BRIEF DESCRIPTION OF THE DRAWINGS

The present invention is illustrated by way of example and not by way of limitations in the figures accompanying drawings in which like reference numerals refers to similar elements and in which.

DETAILED DESCRIPTION OF THE INVENTION

Reference will now be made in detail to the embodiments of the invention, a shield power and ground mesh to remove both capacitive and inductive signal coupling effects of routing in ASIC chips, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not to obscure aspects of the present invention unnecessarily.

Figure 1:
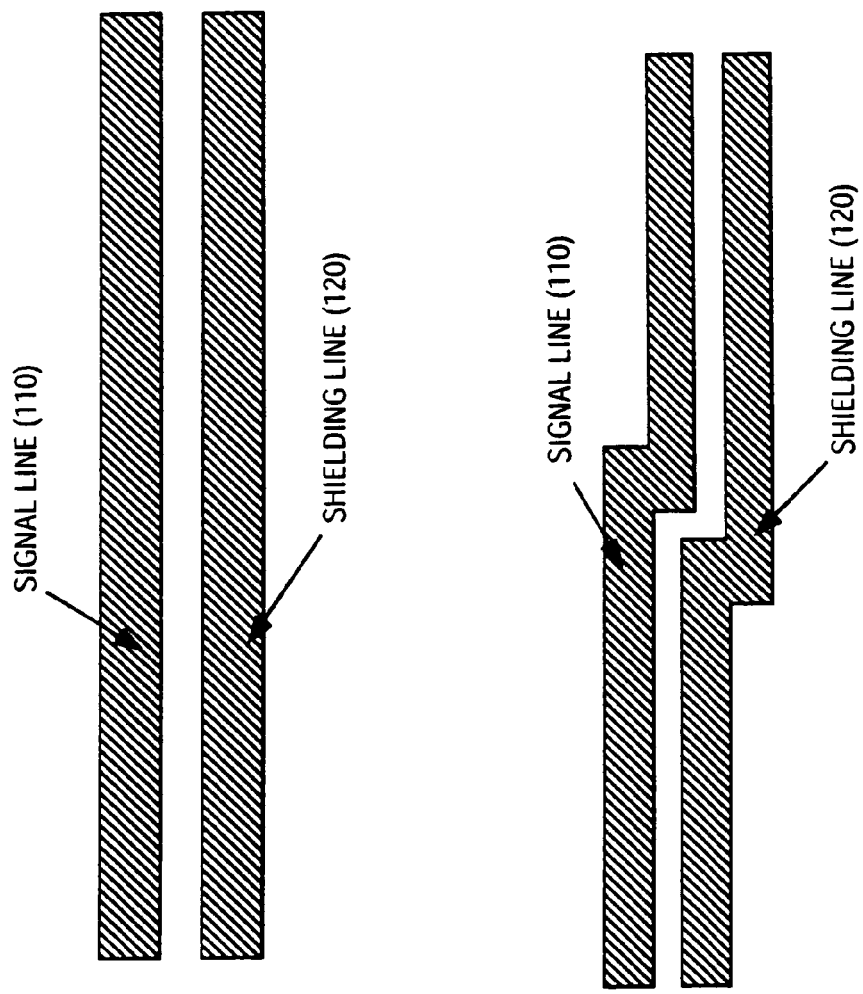
FIG. 1 shows a top view of a shielding line and a signal line.

The present invention describes a circuit device that comprises a plurality of signal lines of given thickness disposed within a substrate that will in addition to providing power to the circuitry of said substrate circuit, will also perform as a shielding mesh that is utilized to reduce the effects of crosstalk between nearby signal lines of said plurality of signal lines within said circuit As shown in depiction 100 of FIG. 1, the signal line 110 is routed along with the shielding line 120, which is then utilized to shield the noise from a neighboring signal line. As discussed earlier, for sub-micron technologies, the lengths of these signal and shield lines can become relatively long (up to 100 uM) with respect to line thickness (for example: as short as 0.13 uM) and thus can lead to high signal to noise ratio or cross-talk within a said circuit on a given substrate.

Figure 2:
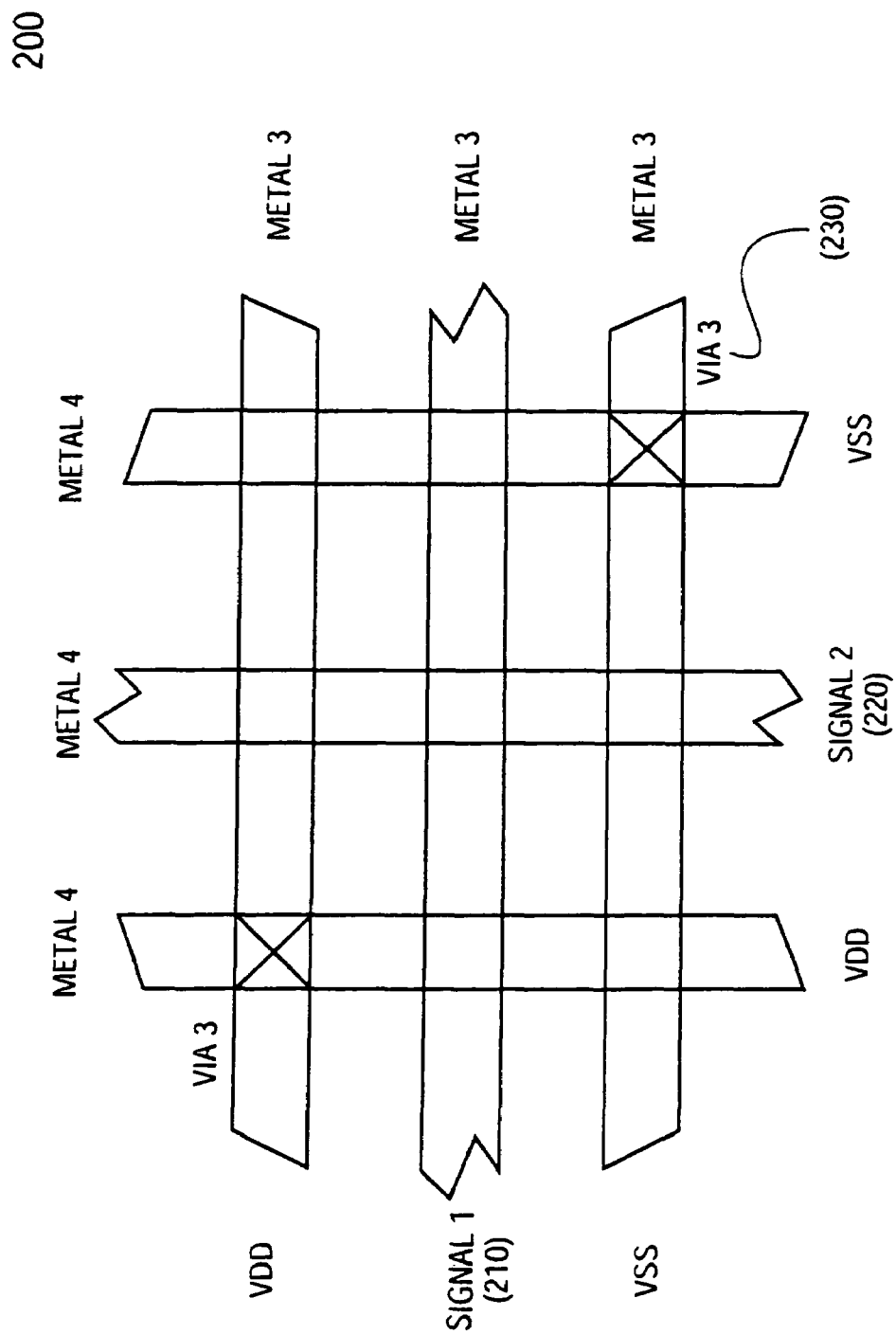
FIG. 2 shows a top view of two layers indicating a grid layout according to a shield mesh of one embodiment of the present invention.

According to one embodiment of the present invention, 200, FIG. 2 depicts a single signal line, 210, which is shielded on both sides by utilizing a three dimensional shield mesh of alternating VDD and VSS lines. On another layer, e.g. metal 4, these alternating VDD and VSS lines are running perpendicular (at 90 degrees) from the previous layer, for example: metal 3, and are further connected at junctions formed by VIA3, 230, to form a three dimensional shield mesh of VDD and VSS shield lines for signal line 220. In accordance with one embodiment of the present invention it is appreciated that the shield mesh is included on an IC in addition to a power grid used to supply power and ground to the circuitry. According to another embodiment, for example in a 0.25 uM technology, the relative segment distance of the VDD and VSS lines may be reduced by as much as 0.94 uM. Reducing the segment length of VDD and VSS reduces their effective RC component and thereby reducing the coupling effects of noise.

Figure 3:
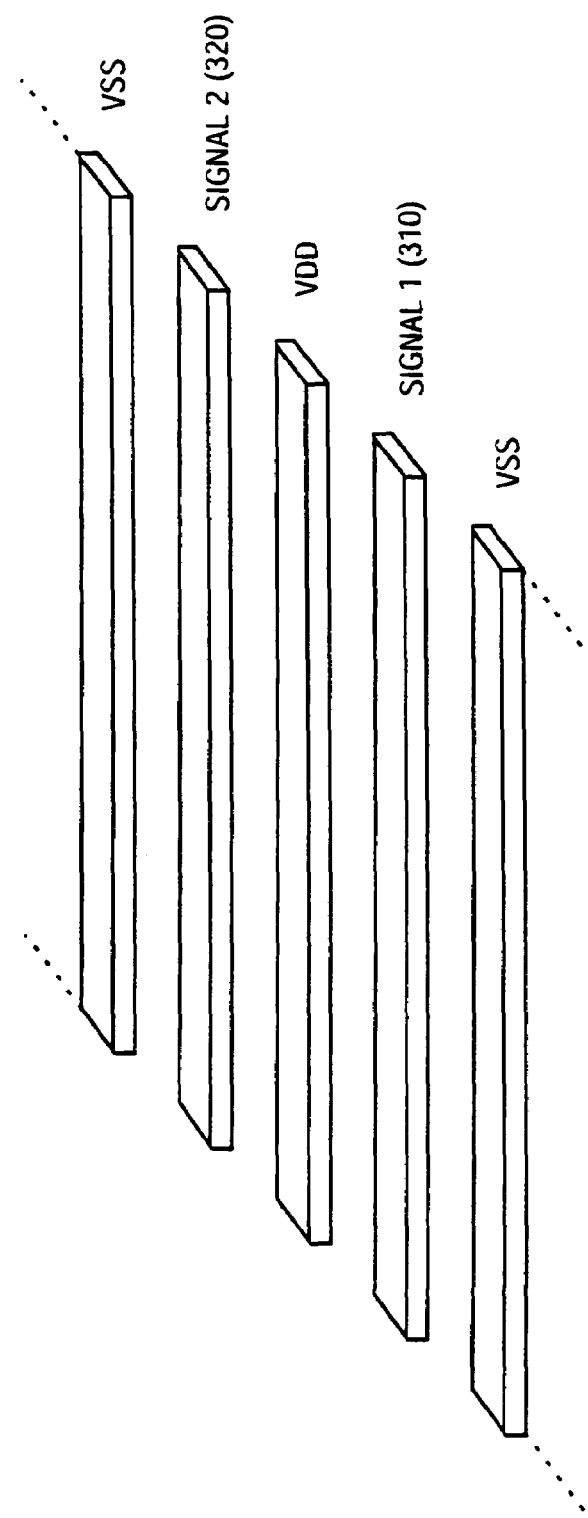
FIG. 3 shows a planar 2-D view of a shield mesh where the signal lines 1 and 2 of same thickness between VDD and VSS lines are on the same layer according to another embodiment of the present invention.

According to another embodiment, 300, of the present invention, FIG. 3 depicts a planar, perspective view of the shield mesh where signal lines 310 and 320 of same thickness are interwoven between alternating VDD and VSS lines on the same layer and of same thickness. Therefore, FIG. 3 illustrates a single layer embodiment of the shield mesh of the present invention. According to an embodiment of shield mesh of the present invention, FIG. 3 illustrates the fact that the due to close proximity of the shielding lines coupled with the fact that these shielding lines will consist of relatively short segments, it can be derived that the effective RC impedance is reduced and thereby the signal coupling between signal lines 310 and 320 is further reduced. According to another embodiment, FIG. 3 also illustrates that the signal lines 310 and 320 are isolated with alternating VDD and VSS shield mesh of the same thickness; depending on technology used, thickness can vary from 0.25 uM to 0.13 uM and even smaller as the industry trends toward further reduction.

Figure 4:
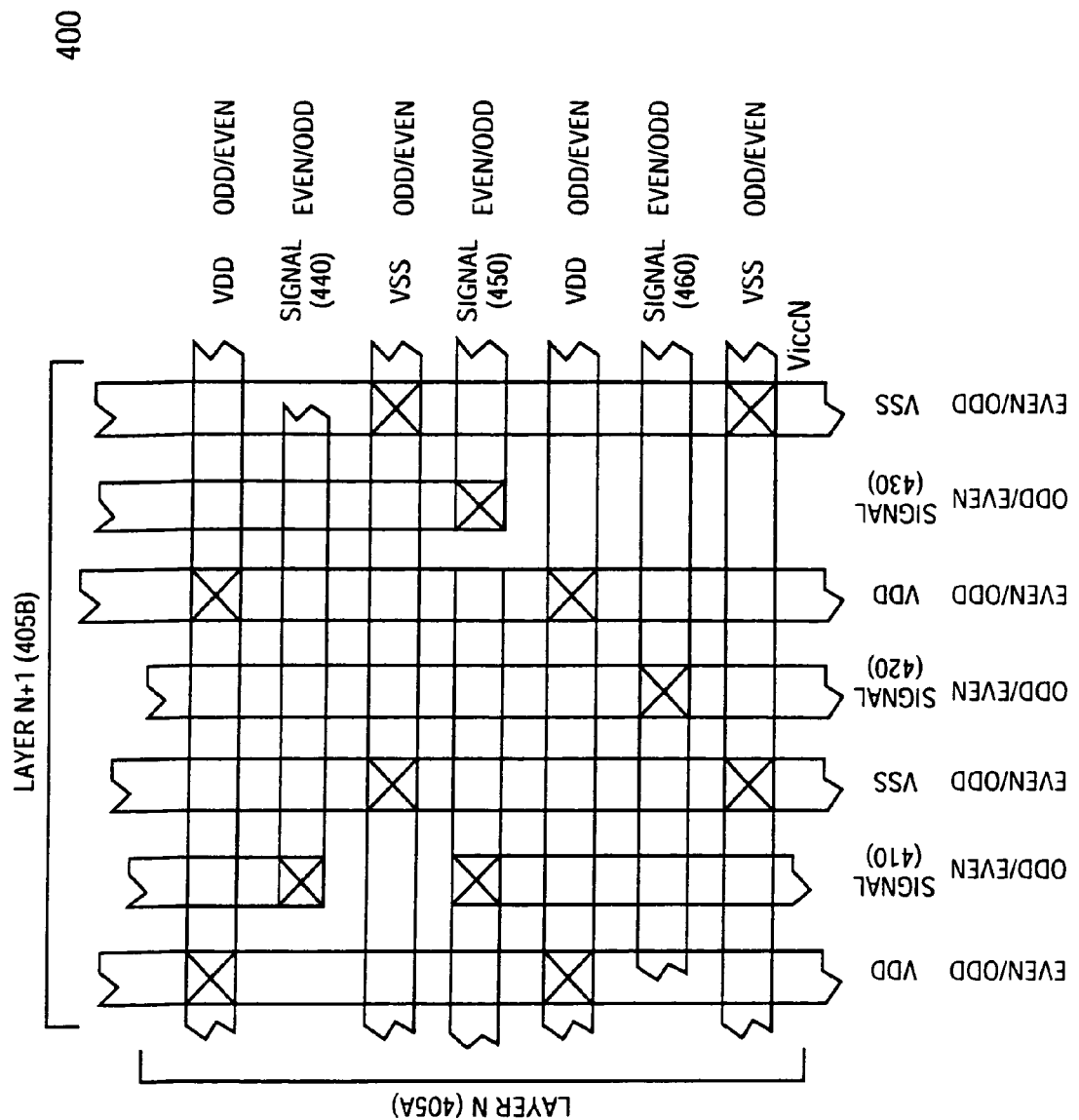
FIG. 4 shows a top view of a shield mesh comprising of two adjacent layers depicting signal lines and VDD and VSS lines on each layer and the appropriate vias between the two layers.

FIG. 4 is a top view of shield mesh embodiment 400 showing two adjacent substrate layers, 405A and 405B, depicting the signal lines (410, 420 and 430), alternating VDD and VSS lines on each layer and the appropriate vias between the two layers utilizing a grid layout. Each via provides layer connections and also reduces the segment size of the shielding mesh and thereby reduces the effective R-C resistance according to one embodiment of the present invention. It is important to note that on layer N, 405A, if the signal lines 410, 420 and 430 are on odd grid tracks, then the VDD and VSS lines will be on even grid tracks, and vice-versa. Like wise, on layer N+1, 405B, if the signal lines 440, 450 and 460 are on even tracks, then the VDD and VSS lines will alternately be on odd grid tracks and vice-versa.

Multi-layer routing assignment to signals and shields: for the vertical space, the track assignment should be done so that there would not be signal tracks directly on top of one another to avoid top bottom coupling. For example, if signals on layer N are on odd tracks, signals on layer N+2, which has the same routing direction as layer N, would be routed on even tracks. This strategy would enable the signals to be shielded by opposite power/ground both on the left/right, and on top/bottom. Thereby, further reducing the segment lengths and increasing the effective isolation between signal lines to reduce noise coupling.

Figure 5:
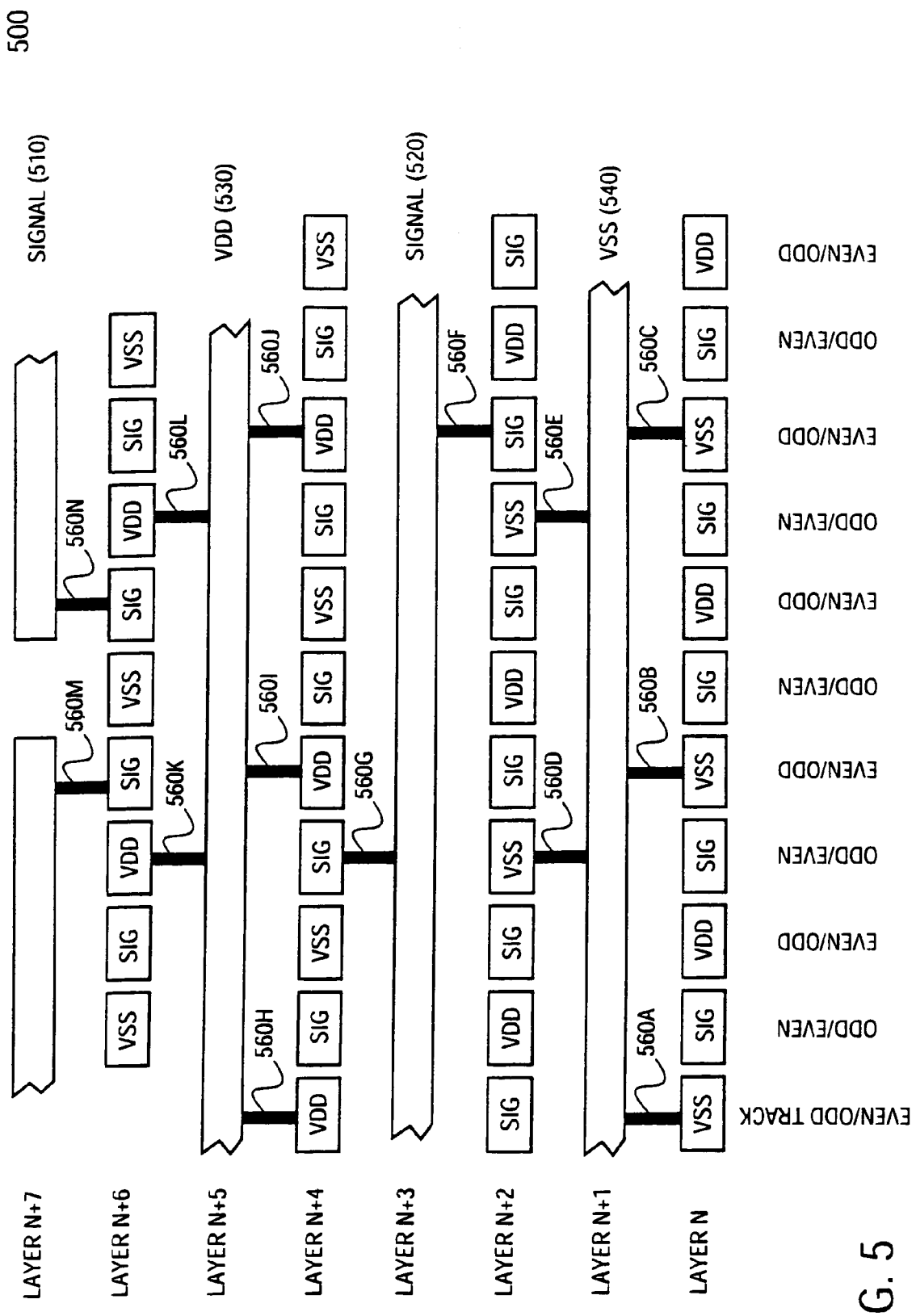
FIG. 5 shows a vertical cross-sectional view of a shield mesh having several layers with signal lines, VDD and VSS lines with their appropriate vias on odd/even grid tracks.

FIG. 5 shows a vertical cross-sectional view of another embodiment 500 of the present invention, that depicts the three dimensional aspect of the shield grid mesh. Several layers, N through N+7, are shown with signals and alternating VDD and VSS lines and their appropriate vias on odd/even grid tracks. As seen FIG. 5, the cross-sectional cuts are taken across signal lines (510 and 520) and VDDNSS lines (530 and 540, respectively). As shown on layer N, layer N+2, layer N+4 and N+6, the VDD, signal and VSS lines are also alternatively arranged on odd, even tracks as described in FIG. 4. Therefore, the shield mesh of FIG. 5 is grid line aligned. Another embodiment of the present invention connects adjacent layers by means of vias as shown in elements 560A through 560N. According to another embodiment of the present invention, this multi-layer shielding mesh reduces each component length and thereby according to one embodiment of the present invention, further reduces the coupling effects.

Figure 6:
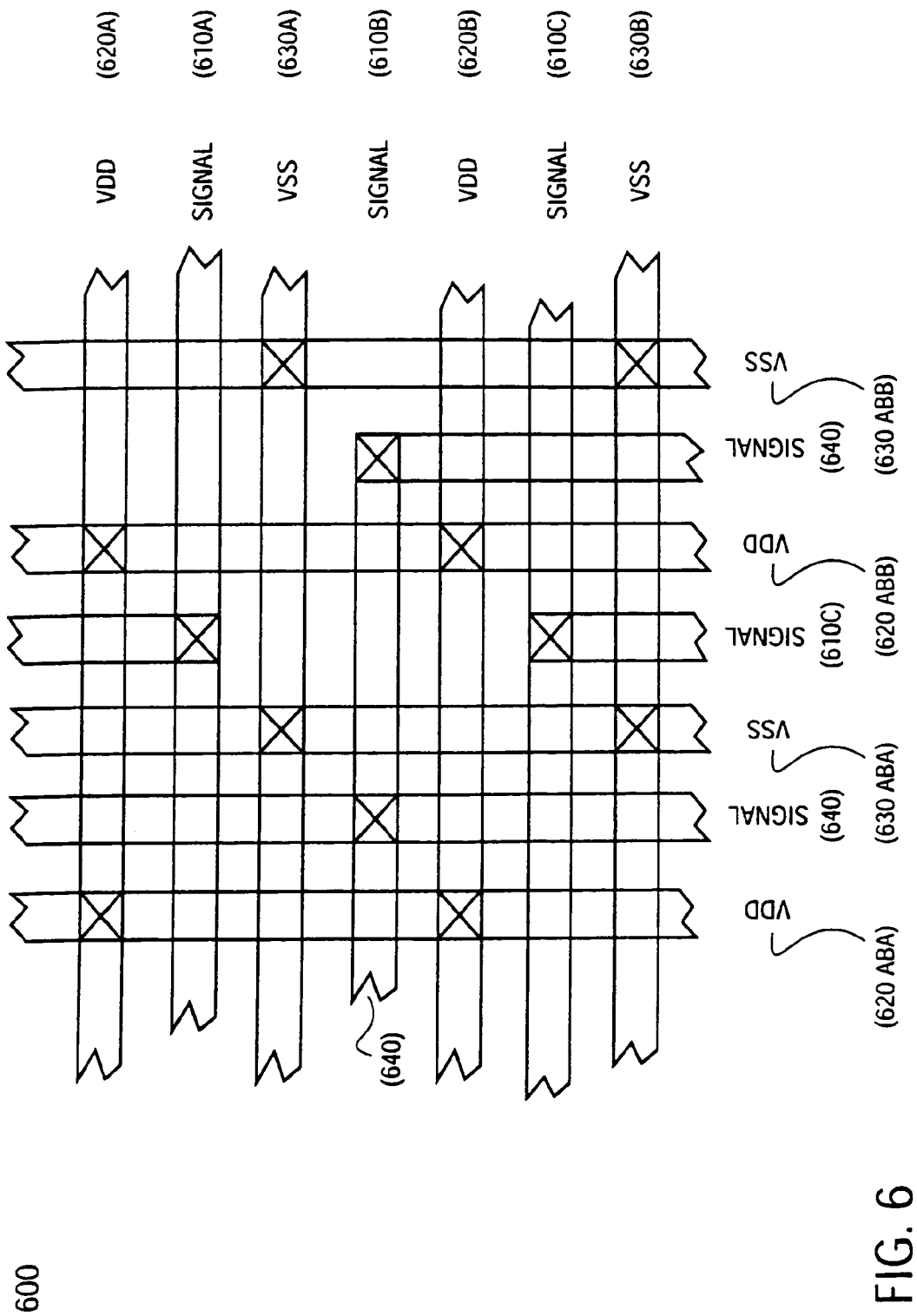
FIG. 6 shows a top view of two adjacent layers of a shield mesh indicating signals, the VDD and VSS lines in a gridless routing technique with their appropriate vias.

FIG. 6 shows another embodiment, 600, of the present invention which depicts a top view of two adjacent layers indicating the signal and alternating VDD and VSS lines in a gridless routing shield mesh with their appropriate vias. As shown, signal 640 is routed on two separate layers and is shielded by a gridless mesh, which includes adjacent VDD (620ABB) and VSS (630ABB) lines on one layer. The same 640 signal line is shielded by VDD (620B) and VSS (630A) lines on another adjacent layer that are 90 degrees alignment to the first layer. Signal line, 640, in this example is routed again on the previous layer, again 90 degrees apart, and is shielded by VDD (620ABA) and VSS (630ABA) lines. Likewise, according to another embodiment of the present invention, signal lines 610A, 610B and 610C can also be traced to have shielding on both adjacent (side-by-side) layers as well as vertical (top-to-bottom) layers. This multi-layer shielding mesh reduces each component length and thereby according to one embodiment of the present invention, further reduces the coupling effects in a gridless routing technique.

Figure 7:
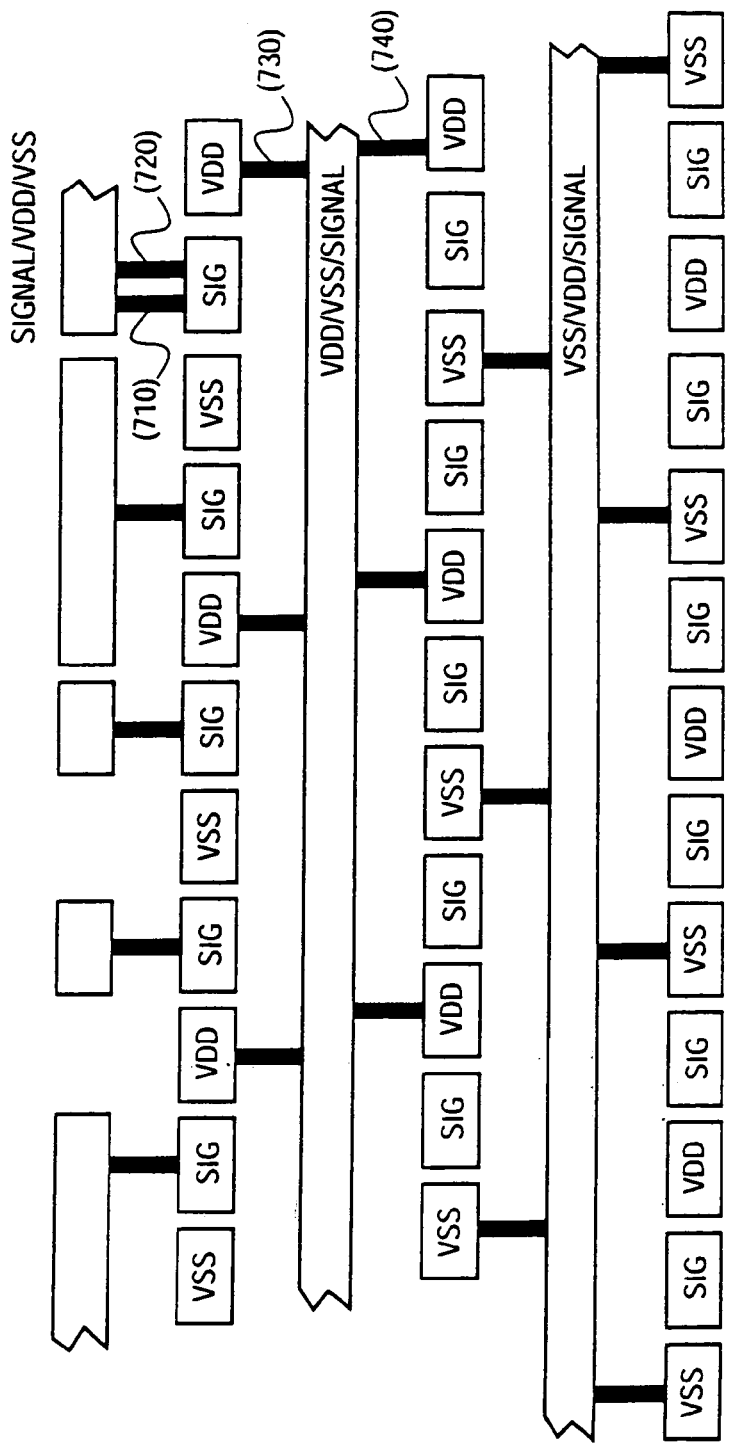
FIG. 7 shows a vertical cross-sectional view of a gridless routing embodiment of the shield mesh showing the signal lines with VDD and VSS lines and their appropriate vias.

According to another embodiment, 700, of the present invention, FIG. 7 shows a vertical cross-sectional view of a gridless shielding mesh showing signals and alternating VDD and VSS lines with their appropriate vias for connecting between adjacent layers. As shown in vias 710 and 720, the distance between segment size is not bound by grid width. This gridless example can again be seen in vias 730 and 740. According to another embodiment of the present invention, vias of varying sizes can be utilized in as close proximity as possible without dependency of grid size. Utilizing the close proximity of the vias, relative segment lengths of each signal, VDD or VSS shielding mesh is reduced. According to another embodiment of the present invention, the shielding mesh is utilized to provide a path for connecting an integrated circuit device to the main power grid. As shown in FIG. 7, line 740 is connected using two short segments, 710 and 720 to tap to the shielding mesh of either VDD or VSS which are in turn connected to the main power grid.

Figure 8:
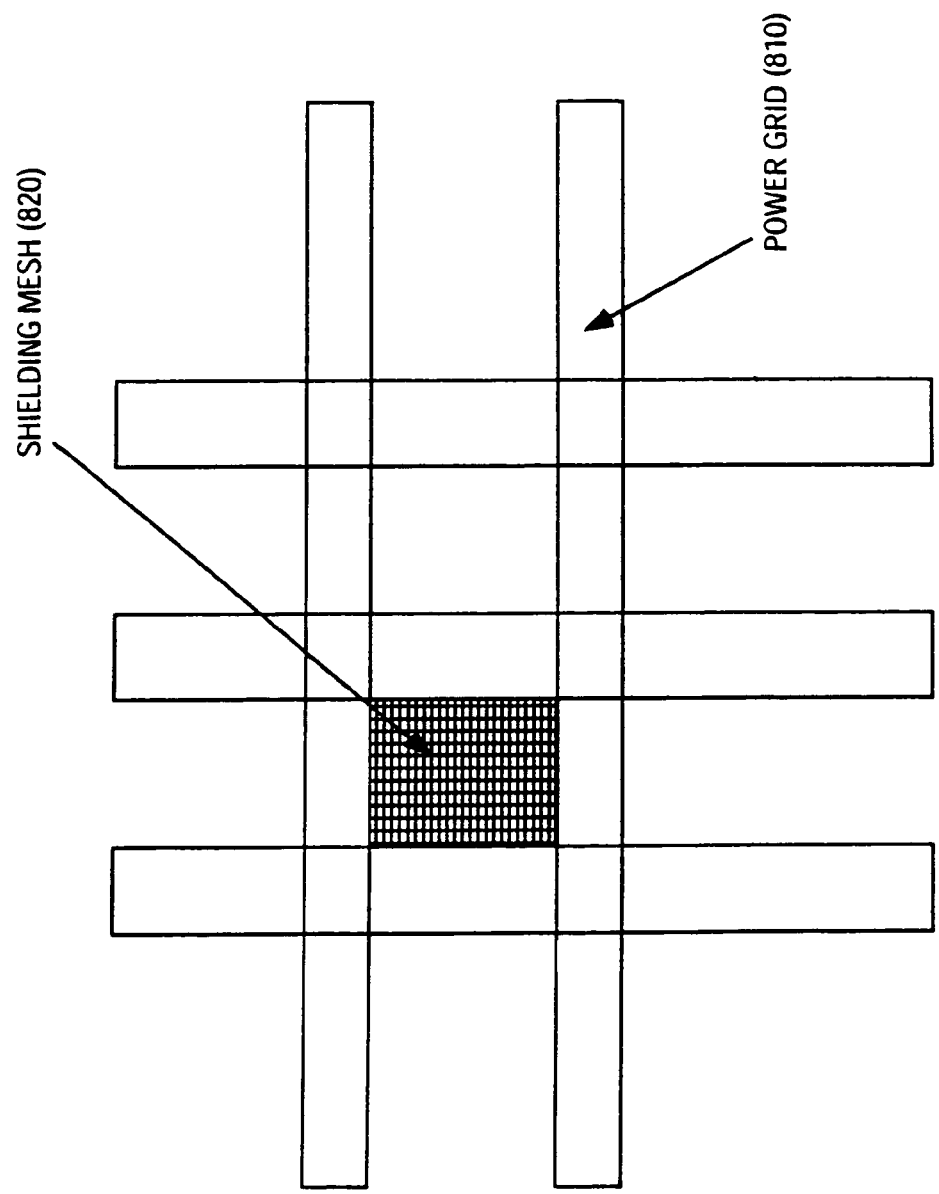
FIG. 8 shows a shielding mesh within a power grid on said substrate according to one embodiment of the present invention.

According to embodiment, 800, FIG. 8 shows an integrated circuit with a shielding mesh (820) and a power grid (810) on a substrate. The shielding mesh is utilized to reduce the capacitive and inductive effects of cross-talk while the power grid is provided to deliver power and ground to IC circuits. The lines of the power grid are much larger than the VSS and VDD lines of the shielding mesh, which are sized to be the size of the signal lines. According to this embodiment, the size difference between the shielding mesh lines and the true power grid lines may vary by factor of 2 to factor of 10. However, due to their relative small segment lengths, the shielding mesh in function, reduces the effective RC component of the lines being connected to. This in turn reduces the noise and coupling effect and therefore, the shielding mesh can be deployed on any substrate area where routing resources are used.

Figure 9:
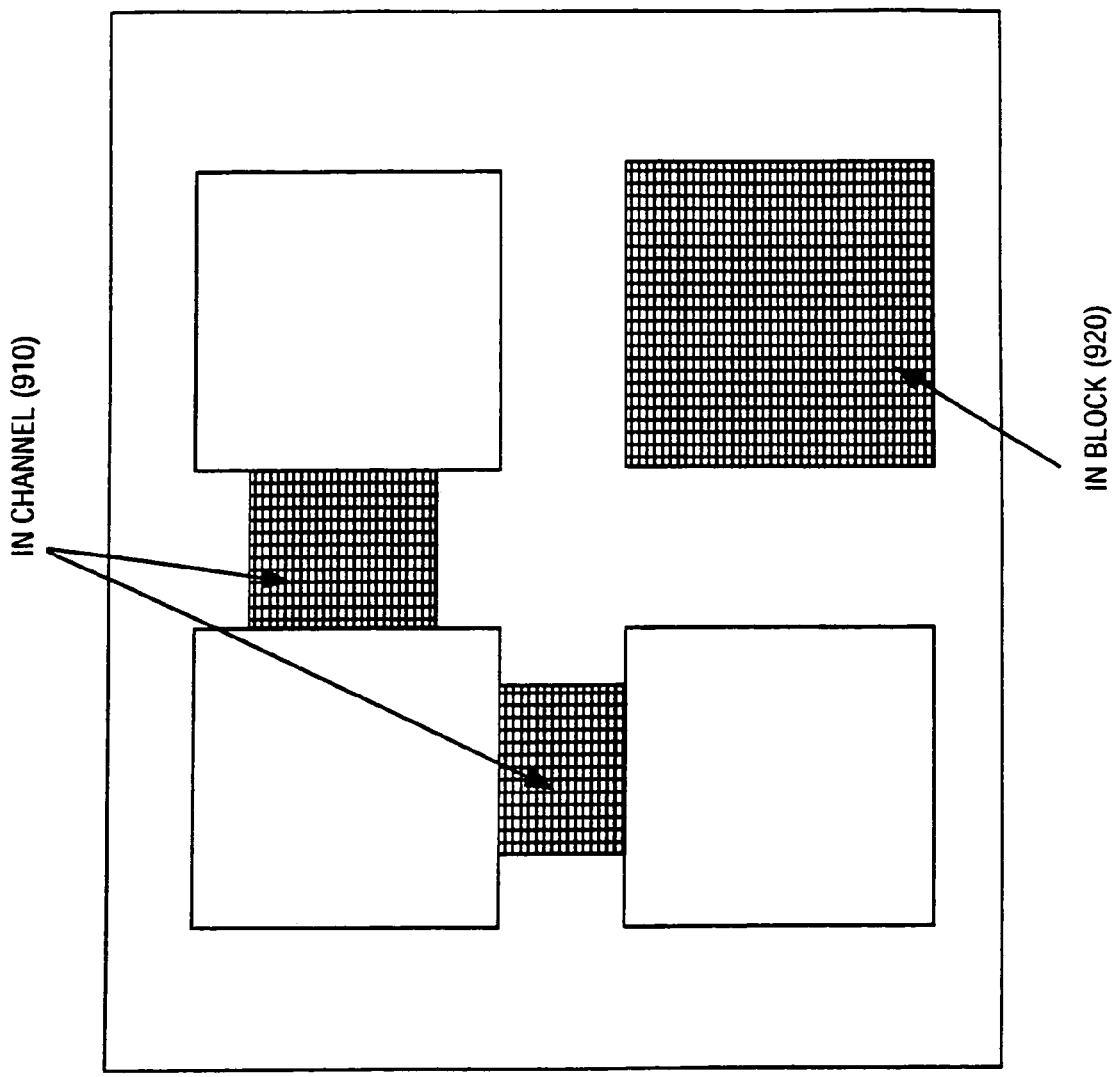
FIG. 9 depicts the shielding mesh within a channel on said substrate and within a block on said substrate according to another embodiment of the present invention.

FIG. 9 depicts embodiment 900, which depicts a shielding mesh in the routing channel (910) between blocks on a substrate and also within a block (920) of a substrate. As described in FIG. 8, due to relative small segment lengths of the shielding mesh, the shielding mesh further reduces the effective RC component of the routing line thereby reducing the noise and coupling effects caused by cross-talk between signal lines.

Figure 10:
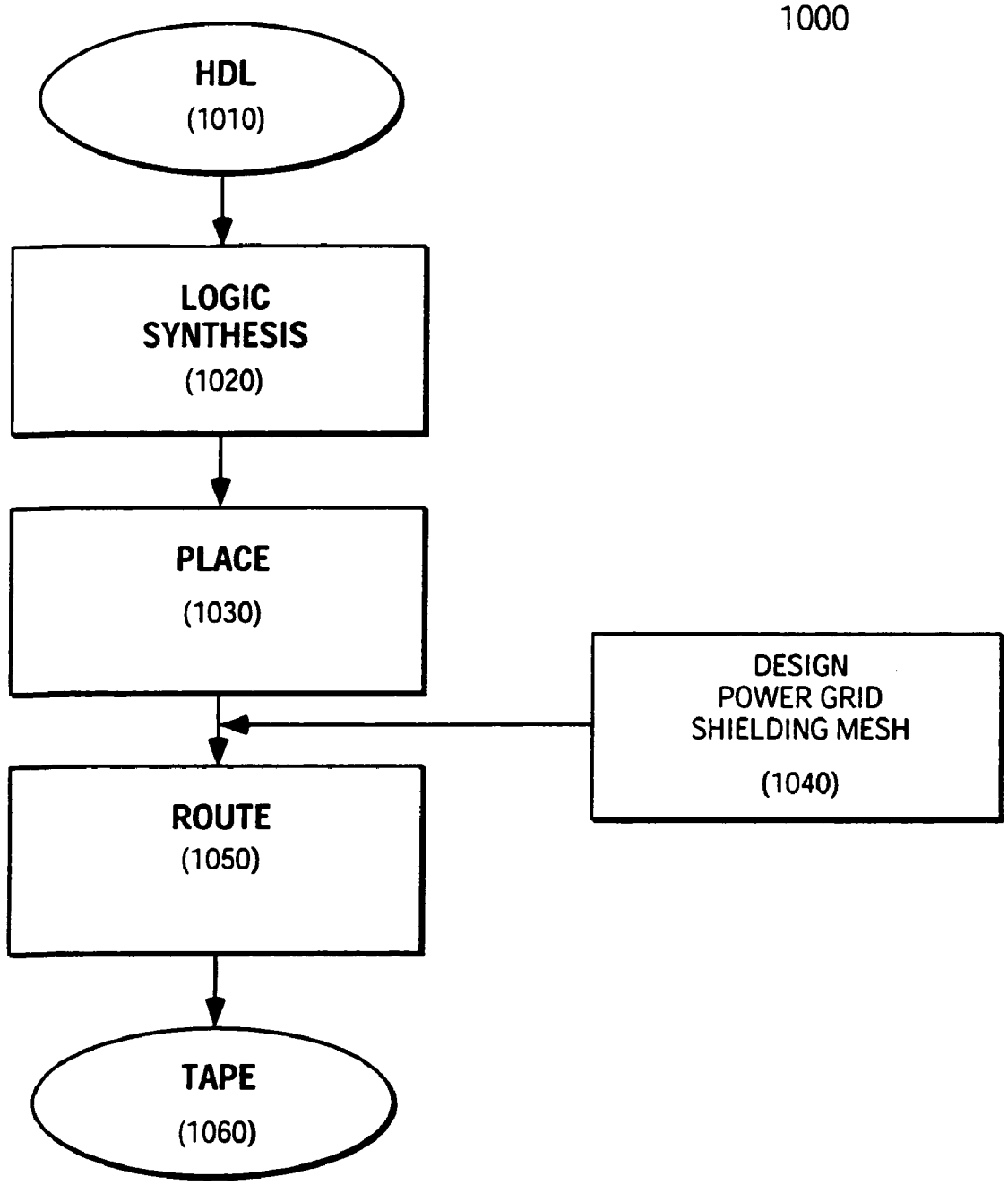
FIG. 10 shows a block diagram depicting a process from logic synthesis to placer to router to tape.

FIG. 10 illustrates the flow chart of steps for the process, 1000, of an EDA tool in which the shielding mesh of the present invention may be introduced. As shown in this embodiment of the present invention, initial code is generally written using HDL, step 1010, (for example) after which logic synthesis, step 1020, is performed. Placement of a power grid is next performed as shown in block 1030. For example where substrate grid is is utilized, shielding mesh as outlined in one embodiment of the present invention can be introduced as shown at point 1040. After this point, the router, 1050, will route the designed circuit and handle the shielding mesh within its parameters. At this point, the design is put on tape (1060).

However, it is important to note that it is not necessary to introduce the shielding mesh on a substrate grid. As described earlier, another embodiment of the present invention allows for said shielding mesh to be introduced in a gridless design on a given substrate. For gridless routing, router (1050) can introduce the shielding mesh into the said substrate.

This fully connected power and ground shielding mesh can be used when it is important to remove capacitive and inductive coupling. The main sources for this mesh would be from the main power grid trunks or independent power and ground trunks dedicated for shielding where they are relatively noiseless.

The shielding mesh can also be used in standard cell or gate array routing area, routing channels or routing channels on top of hard macros, data bus routing, control bus routing, address bus routing, analog signal routing, clocks and clock bus routing, or any other signal lines.

With the addition of this fully connected power and ground shielding mesh, the automated VDSM chip routing can be much more worry-free, and almost unpredictable coupling errors can be virtually eradicated by the present invention.

What is claimed is:

1. An integrated circuit device, comprising:
   a substrate;
   circuitry disposed on said substrate;
   a plurality of signal lines disposed on said substrate to interconnect portions of said circuitry on said substrate;
   a power grid disposed on said substrate, the power grid comprising:
      a plurality of first lines to supply a first voltage level to said circuitry on said substrate; and
      a plurality of second lines to supply a second voltage level to said circuitry on said substrate;
   a shield mesh disposed on said substrate, the shield mesh comprising:
      a plurality of third lines to supply the first voltage level on said substrate; and
      a plurality of fourth lines to supply the second voltage level on said substrate;
   wherein each of said signal lines is disposed between and adjacent to a respective one of said third lines of said shield mesh and a respective one of said fourth lines of said shield mesh within a layer on said substrate to reduce effects of electronic cross-talk between nearby ones of said signal lines; and
      wherein the first lines and the second lines are thicker, by a factor of at least two, than the third and the fourth lines.

2. An integrated circuit as in claim 1, wherein said first and second voltage levels are ground and power respectively.

3. An integrated circuit as in claim 1, wherein segment lengths of said third and fourth lines of said shield mesh are substantially smaller than segment lengths of said first and second lines of said power grid.

4. An integrated circuit as in claim 1, wherein a first portion of said first lines and a first portion of said third lines are parallel along a first direction within a first layer on said substrate; a second portion of a first lines and a second portion of said third lines are parallel along a second direction within a second layer on said substrate; and, said first direction is at an angle with said second direction.

5. An integrated circuit as in claim 4, wherein said shield mesh further comprises a plurality of vias interconnecting said first and second portions of said third lines.

6. An integrated circuit device, comprising:
   a substrate;
   circuitry disposed on said substrate;
   a plurality of signal lines disposed on said substrate to interconnect portions of said circuitry on said substrate;
   a power grid disposed on said substrate, the power grid comprising:
      a plurality of first lines having a first thickness to supply a first voltage level to said circuitry on said substrate; and
      a plurality of second lines to supply a second voltage level to said circuitry on said substrate;
   a shield mesh disposed on said substrate, the shield mesh comprising:
      a plurality of third lines having a second thickness to supply a third voltage level on said substrate; and
      a plurality of fourth lines to supply a fourth voltage level on said substrate;
   wherein each of said signal lines is disposed between and adjacent to a respective one of said third lines of said shield mesh and a respective one of said fourth lines of said shield mesh within a respective layer on said substrate to reduce effects of electronic cross-talk between nearby ones of said signal lines; and
   wherein, perpendicularly across layers of said substrate, each of said signal lines is vertically adjacent to at least one of a parallel one of said third lines of said shield mesh and a parallel one of said fourth lines of said shield mesh but not vertically adjacent to a parallel signal line.

7. An integrated circuit as in claim 6, wherein said first and second voltage levels are ground and power respectively; and, said third and fourth voltage levels are VSS and VDD respectively; and wherein each of said signal lines is vertically and horizontally shielded.

8. An integrated circuit as in claim 6, wherein said shield mesh further comprises:
   first vias interconnecting said third lines across layers of said substrate; and,
   second vias interconnecting said fourth lines across layers of said substrate.

* * * * *